United States Patent [19]

Yasunaga et al.

[11] Patent Number: 5,068,605
[45] Date of Patent: Nov. 26, 1991

[54] SEMICONDUCTOR INTEGRATED CIRCUIT DEVICE AND METHOD OF TESTING THE SAME

[75] Inventors: Moritoshi Yasunaga, Kawaguchi; Noboru Masuda, Kokubunji; Hideo Todokoro, Tokyo; Yasunari Umemoto, Tokorozawa; Hirotoshi Tanaka, Yamanashi; Hiroyuki Itoh, Kodaira, all of Japan

[73] Assignee: Hitachi, Ltd., Tokyo, Japan

[21] Appl. No.: 404,355

[22] Filed: Sep. 7, 1989

[30] Foreign Application Priority Data

Sep. 7, 1988 [JP] Japan .................................. 63-222315

[51] Int. Cl.⁵ ........................ G01R 31/28; G06F 11/00
[52] U.S. Cl. ................................ 324/158 R; 324/73.1;
371/15.1; 371/22.1; 371/22.6
[58] Field of Search ...................... 324/158 R, 158 D;
382/8; 358/106, 107; 250/310, 311; 307/440,
445, 460, 443, 465, 468; 357/41; 371/22.6, 22.1,
25.1, 15.1; 329/537

[56] References Cited

U.S. PATENT DOCUMENTS

| | | | |
|---|---|---|---|
| 4,736,159 | 4/1988 | Shiragasawa et al. | 324/158 R |
| 4,758,782 | 7/1988 | Kobayashi | 382/8 |
| 4,794,646 | 12/1988 | Takeuchi et al. | 382/8 |
| 4,847,911 | 7/1989 | Morimoto et al. | 382/8 |
| 4,881,029 | 11/1989 | Kawamura | 324/158 R |
| 4,972,144 | 11/1990 | Lyon et al. | 324/158 R |
| 4,973,904 | 11/1990 | Sonnek | 371/22.1 |
| 5,012,185 | 4/1991 | Ohfuji | 324/158 R |

OTHER PUBLICATIONS

Williams et al., "Design for Testability–A Survey"; Proceedings of the IEEE, vol. 71, No. 1, Jan. 1983; pp. 98–112.
LaPaugh et al., "Total Stuck at Fault Testing by Circuit Transformation"; Proceedings of the IEEE; 20th Design Automation Conference; pp. 713–716; 1983.
Harman & Kardon Catalog No. 515, "Digital Logic"; p. 12.

Primary Examiner—Kenneth A. Wieder
Assistant Examiner—Vinh P. Nguyen
Attorney, Agent, or Firm—Antonelli, Terry, Stout & Kraus

[57] ABSTRACT

A semiconductor integrated circuit device includes: input terminals; output terminals; a group of gates which receives an input signal applied to the input terminals and outputs an output signal from the output terminals, the output signal corresponding to the state of the input signal; and an arrangement for forcibly setting the output of each gate constituting the group either at a "1" level or at a "0" level irrespective of the state of the input signal and the state of an input signal to each gate. The arrangement for forcibly setting the output is an arrangement for changing the potential of a semiconductor substrate in which each gate is formed. This arrangement for changing potential includes an impurity doped region formed in the semiconductor substrate, the impurity doped region surrounding at least a transistor constituting each gate so as to apply a potential to the transistor, and a terminal for applying the potential to the impurity doped region. The semiconductor integrated circuit device according to another aspect includes an observation pad formed on a portion of at least one of the output and input areas of each gate, the observation pad being exposed without being covered with an insulator layer and the potential of the observation pad being observed as a difference of shading by using an electron or ion beam tester. A fault of each gate can be detected in accordance with a shading image of the observation pads.

31 Claims, 16 Drawing Sheets

| ITEM NO. | A INPUT TEST PATTERN | OUTPUT DATA | FAULTY GATE NO. | FAULT MODE |
|---|---|---|---|---|
| 1 | 1010000 | 1110000 | 100 | 1 |
| 2 | 1001110 | 1010100 | 50 | 0 |
| 3 | 1001001 | 0110011 | 4 | 1 |
| 4 | 1010110 | 0011010 | 3 | 0 |
| 5 | 1001001 | 0110011 | 10 | 1 |
| 6 | 0101001 | 1001001 | 2 | 0 |
| 7 | 1111000 | 0000110 | 999 | 1 |
| | | | | |

F I G. 9A
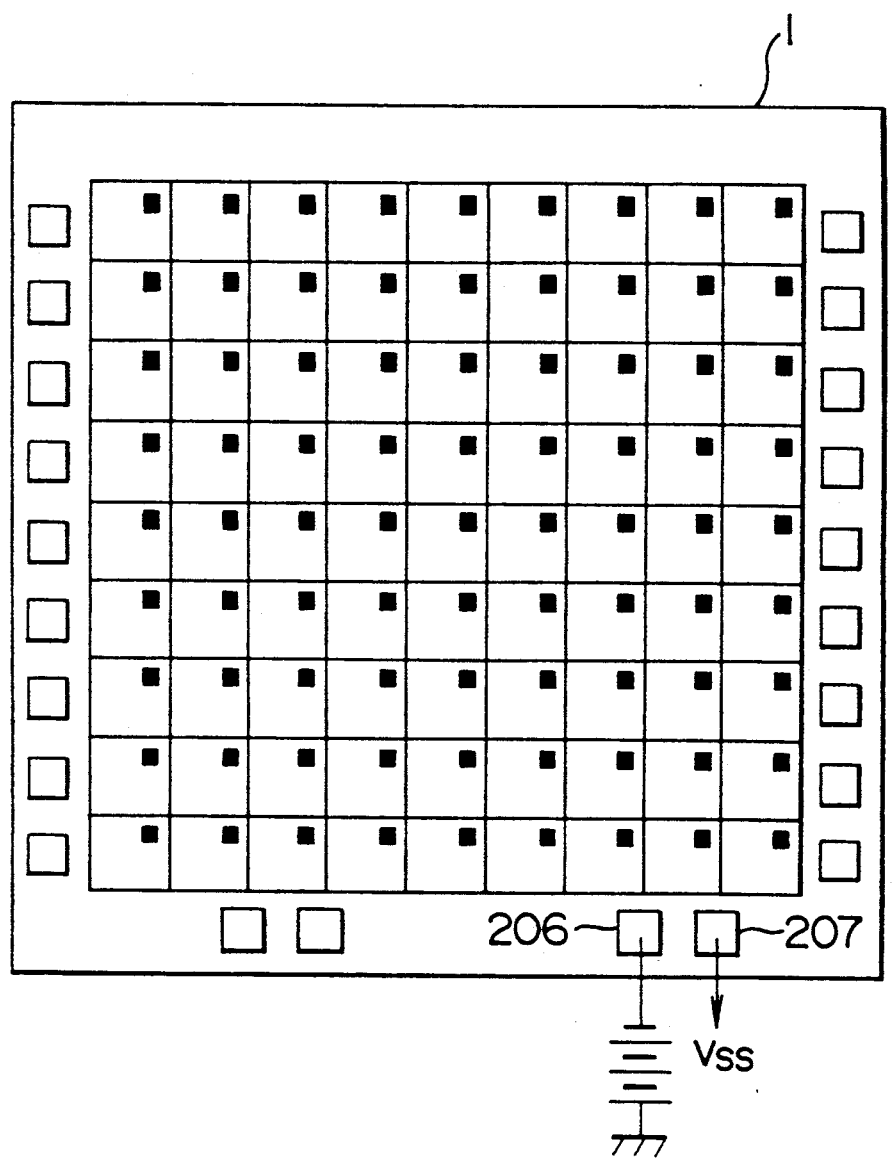

SEMICONDUCTOR INTEGRATED CIRCUIT DEVICE AND METHOD OF TESTING THE SAME

BACKGROUND OF THE INVENTION

The present invention relates to a semiconductor integrated circuit device (hereinafter called LSI device) and a method of testing the same. More particularly, the present invention relates to LSI devices and a method of testing the same, capable of detecting faults of an LSI device at high speed and with high precision without lowering the performance of an LSI device.

A conventional method of detecting a faulty gate in an LSI device is disclosed in, for example, Proceedings of the IEEE, Vol. 71, No. 1, pp. 98 to 112, January 1983. The outline of this testing method will be described with reference to FIG. 2. The term "fault" used in the above-noted Proceedings means that a signal level is fixed to (stuck at) a certain level An LSI device 1 is constructed of a plurality of gates 2. A test pattern 4 composed of "1" and "0" as shown in FIG. 2 is applied to a number of signal input pins 3 to obtain output data 5 from a number of signal output pins 6. If the output data 5 are different from the expected fault-free machine's output data, the output data 5 are compared with a fault simulation table to thereby detect a fault, in this example, a No. 3 faulty gate 7. The fault simulation table has the contents as shown in FIG. 2. With this table, the number C of a faulty gate can be identified based on the test pattern A and the corresponding output data B. Such tables are prepared for each type of LSI devices and used when LSI devices are tested. In the table shown in FIG. 2, the item No. 4 indicates that the gate No. 3 is a faulty gate. The test pattern A=1010110 and the output data B=0011010 correspond to the item No. 4 which indicates that the gate No. 3 is a faulty gate. The fault mode D shows the contents of a fault. For example, at the item No. 4, the output of the No. 3 gate is stuck at "0" level.

The above conventional technique has the following three problems.

(1) Sets of the same test patterns and output data are present so that a faulty gate cannot be correctly identified.

(2) The capacity of a fault simulation table becomes drastically large if a plurality of faulty gates are intended to be detected at a time. It is therefore difficult to form such a table. It is possible to use a faulty simulation table intended to detect faults one at a time. However, it takes a long time to detect all the faults if this approach is followed. Moreover, a problem exists that, in certain instances, a plurality of faults are cancelled out each other and it seems that there is no fault.

(3) It is necessary to prepare a fault simulation table for each type of LSI devices This work increases the time and cost required for the development of LSI devices.

The above three problems will be described more detail.

Problem (1)

This case corresponds to the items Nos. 3 and 5 in the table shown in FIG. 2. The test patterns and output data of the items Nos. 3 and 5 are the same duplicating each other. Consequently, it is not possible to identify a faulty gate as to if it is the No. 4 gate or No. 10 gate.

Problem (2)

As seen from the "faulty gate number" column, the table generally shows the relationship between a single faulty gate and the test pattern and output data. It is very difficult to realize a faulty simulation table which detects a number of faults at a time because the number of combinations of faulty gates drastically increases. It is practically impossible therefore to detect a number of faulty gates in an LSI device in a short time. If a plurality of faulty gates are present, it becomes necessary to check a plurality of item numbers in the table in detecting the faulty gates, thus necessitating a long testing time. In addition, in some cases, a plurality of faulty gates are cancelled out each other so that it is judged erroneously that there is no fault.

Problem (3)

A fault simulation table is required to be prepared for each type of LSI devices. For example, for an information processing apparatus using 100 different types of LSI devices, 100 fault simulation tables are required, thus increasing the time and cost for the development of LSI devices.

A fault results from the events which are not related to the logics of an LSI itself, the events include short circuits or breakages of wiring in an LSI device, presence of an element in a gate turned to be a fixed resistor, and the like. The above three problems result from the fact that such events are detected by using the logics of an LSI device.

Another conventional technique is disclosed in Proceedings of IEEE, 20th Design Automation Conference, pp. 713 to 716, 1983. This technique does not use the fault simulation table so that it is effective in solving the above three problems. However, it is associated with a fatal disadvantage that the performance and yield of an LSI device are lowered. This will be described in more detail.

(a) The scale of an LSI is approximately doubled so that the wiring length between gates increases. This increase in wiring makes a signal transmission delay time longer, resulting in a low operation speed of an LSI device.

(b) The scale of an LSI is approximately doubled so that the yield of an LSI device is lowered considerably. This is apparent from the following yield equation known in the art:

$$Y = \exp(-DA)$$

where Y is a yield of an LSI device, D is a fault density per unit area, and A is the area of an LSI device. If the value A is doubled to 2A, the yield Y lowers exponentially. Testing an LSI device for the purpose of improving a yield happens to go in the wrong way of lowering the yield.

(c) According to this conventional technique, it is necessary to prepare two-fold input signal pins, to apply input signals of "1" level to the half of the input signal pins, and to apply input signals of "0" level to the remaining half. Therefore, if the number of input signal pins is unchanged, I/O inversion circuits are required to be added to the input signal pins. Addition of the inversion circuits lowers the yield. A signal delay time occurs at the inversion circuits so that the operation speed of an LSI device lowers.

SUMMARY OF THE INVENTION

It is an object of the present invention to provide a semiconductor integrated circuit device, capable of solving the problems of the conventional testing techniques according to which a faulty gate is detected based on the logics of an LSI device by using a fault simulation table, and capable of detecting a faulty gate without deteriorating the performance of an LSI device.

It is another object of the present invention to provide a semiconductor integrated circuit device capable of directly detecting a fault in a gate group without using a fault simulation table and scarcely increasing the element size and pin number.

It is a further object of the present invention to provide a semiconductor integrated circuit device capable of observing a fault in a gate group as a difference of shading, by using an electron or ion beam tester.

It is a still further object of the present invention to provide a method of testing a semiconductor integrated circuit device capable of detecting a fault in short time and with high precision, without using a fault simulation table and without deteriorating the performance of an LSI device.

A semiconductor integrated circuit device according to this invention comprises: input terminals; output terminals; a group of gates which receives an input signal applied to said input terminals and outputs an output signal from said output terminals, said output signal corresponding to the state of said input signal; and means for forcibly setting the output of each gate constituting said group either at a 1 level or at a 0 level irrespective of the state of said input signal and the state of an input signal to each gate.

The forcible setting means according to this invention is a means for changing the potential of a semiconductor substrate in which each gate is formed, said potential changing means comprising an impurity doped region formed in said semiconductor substrate, said impurity doped region surrounding at least a transistor constituting each gate so as to apply a potential to said transistor, and a terminal for applying the potential to said impurity doped region.

The means for changing the potential of the substrate is provided for each gate constituting said group or for each transistor constituting each gate.

A semiconductor integrated circuit device according to this invention comprises an observation pad formed on a portion of at least one of the output and input areas of each gate, said observation pad being exposed without being covered with an insulator layer and the potential of said observation pad being observed as a difference of shading by using an electron or ion beam tester.

A fault of each gate can be detected in accordance with a difference of shading between the observation pads.

Each gate comprises at least one drive transistor for receiving an input signal to the gate, and a load transistor for supplying current to said drive transistor, the output of the gate being obtained at the interconnection between said drive transistor and said load transistor.

A plurality of gates constituting the gate group are preferably disposed in a two-dimensional matrix.

The substrate potential changing means is preferably constructed of first means for changing the potential of the substrate region within which said drive transistor is formed, and second means for changing the potential of the substrate region within which said load transistor is formed.

The first means may be provided independently for each drive transistor.

BRIEF DESCRIPTION OF THE DRAWINGS

FIGS. 9A and 9B are schematic illustrations for explaining forcible operation;

DESCRIPTION OF THE PREFERRED EMBODIMENTS

A semiconductor integrated circuit device according to this invention comprises: input terminals (input signal pins); output terminals (output signal pins); a group of gates which receives an input signal applied to said input terminals and outputs an output signal from said output terminals, said output signal corresponding to the state of said input signal; means for forcibly setting the output of each gate constituting said group either at a "1" level or at a "0" level irrespective of the state of said input signal and the state of an signal to each gate.

Figure 1A:
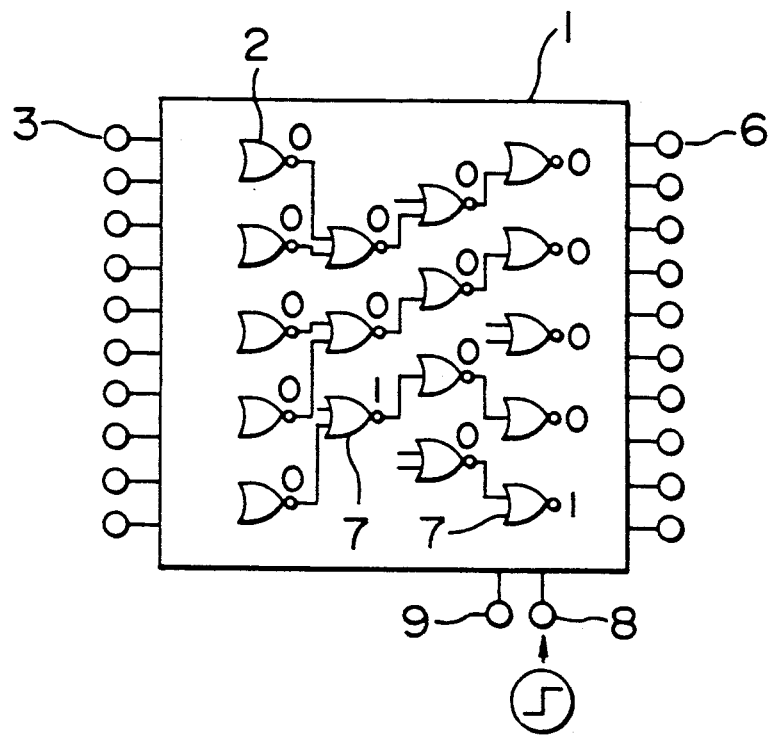
FIGS. 1A and 1B are schematic illustrations for explaining the basic concept of the present invention.
Figure 1B:
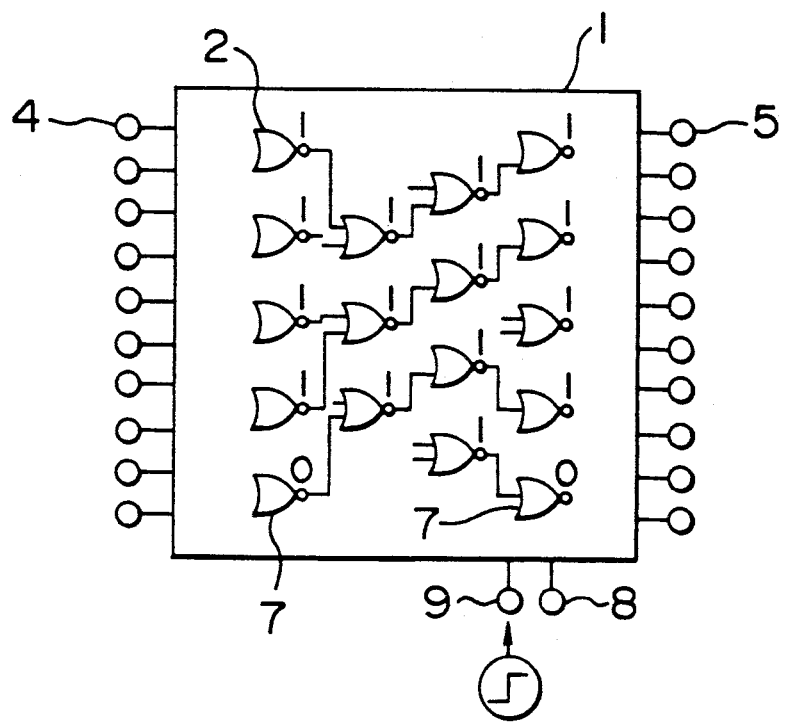
Figure 2:
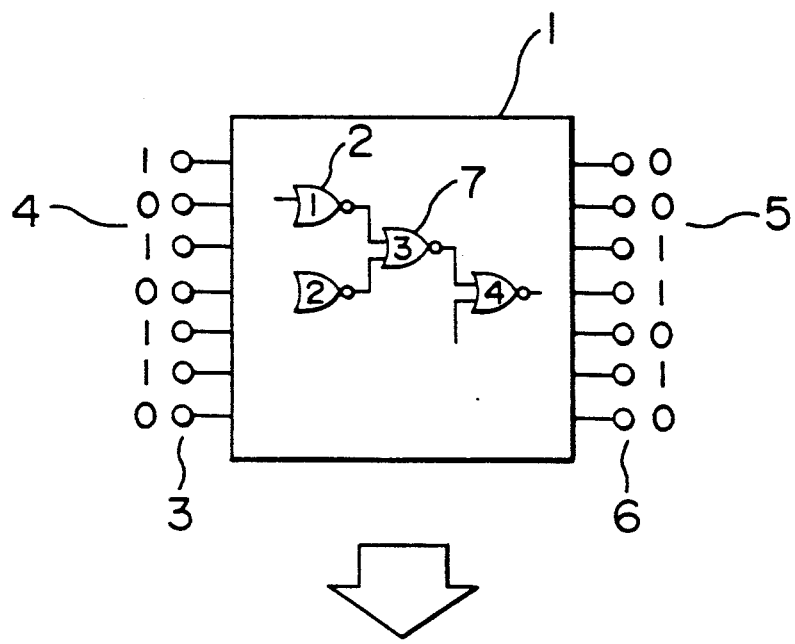
FIG. 2 illustrates a conventional technique.

The structure of an LSI device and the method of testing the LSI device according to this invention will be described with reference to FIG. 1. Reference numeral 1 represents an LSI device, and reference numeral 2 represents a gate. The LSI device 1 is constructed of a plurality of gates 2 directly or indirectly interconnected so as to obtain a desired logic function Reference numeral 3 represents an input signal pin to which an input signal is applied, and reference numeral 6 represents an output signal pin from which an output signal is obtained. An input signal applied to the input signal pins is processed by a number of gates 2 constituting the LSI device 1. An output signal is obtained from the output signal pins 6, and supplied to another LSI device. FIG. 1A illustrates a forcible operation of setting the outputs of all normal gates in the LSI device at a "0" level. A signal for forcibly setting the output of each gate at a "0" level is applied to a signal pin 8. On the other hand, a signal forcibly setting the output of each gate at "1" level is applied to a signal pin 9. In FIG. 1A, a "0" level forcible operation signal is applied to the signal pin 8. Irrespective of the logics of respective gates and the input/output states thereof, the outputs of all gates become "0" at a time if they are normal as shown in FIG. 1A. If there is a gate such as the one indicated at 7 whose output is "1", the gate is detected as a fault gate. In FIG. 1B, a "1" level forcible operation is performed. A gate whose output is "0" as indicated at 7 is detected as a faulty gate.

According to the present invention, a faulty gate is detected independently from the logics of an LSI device, without using the input and output signal pins 3 and 6 of the LSI device 1. Therefore, the present invention solves all the above-described three problems associated with the conventional testing technique using a fault simulation table. The details of the method of forcibly setting a gate at a "1" or "0" level irrespective of the logics of an LSI device, and the method of quickly detecting a gate which did not follow the forcible operation, will be given in the following embodiments. According to the present invention, in testing an LSI device, the size of the device is not required to be made large, thereby preventing the performance and yield of the LSI device from being lowered.

As described above, the present invention aims at providing a technique of solving the problems associated with the conventional testing technique in accordance with which a fault gate whose output is stuck-at "1" or "0" is detected. Further, according to the present invention, faulty gates other than those stuck-at a "fixed level" can also be detected.

Figure 3A:
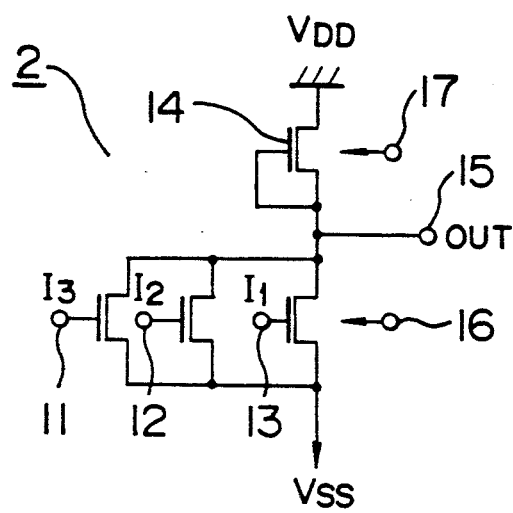
FIGS. 3A to 3C are schematic illustrations for explaining an embodiment of means for forcibly operating a gate.
Figure 3B:
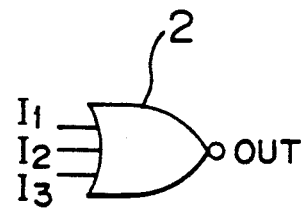
Figure 3C:
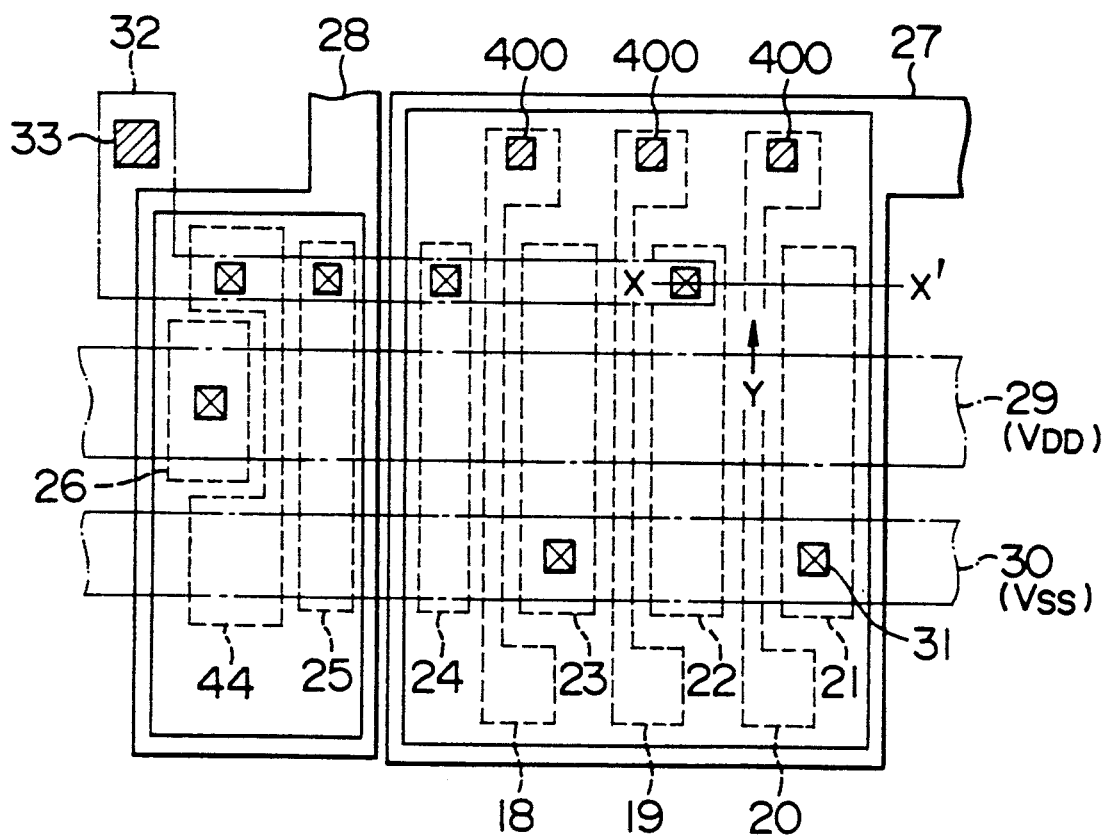

FIGS. 3A to 3C are schematic illustrations for explaining the means for forcibly setting the output of a representative gate 2 at a "1" or "0" level. In this embodiment, a gate is constructed of field effect transistors. FIG. 3A is a circuit diagram of a three input NOR gate constructed of four field effect transistors 11 to 14. The logical symbol thereof is represented as shown in FIG. 3B. The input terminals 11, 12, 13 of the gate 2 correspond to the gate electrodes of drive transistors 11, 12 and 13. A load transistor is indicated at 14. The output terminal 15 of the gate 2 is connected to the input terminal (gate electrode) of another gate, to form integrated circuits having various functions. Reference numerals 16 and 17 represent electrodes connected to the substrate, respectively for the drive transistors 11 to 13 and for the load transistor 14. The gate 2 is forcibly operated by changing the potential of the substrate. In this embodiment, GaAs semiconductor is used. FIG. 3C is a plan view of an embodiment of the layout of a three-input NOR gate 2 shown in FIGS. 3A and 3B formed in a GaAs substrate. Reference numerals 18, 19 and 20 represent the gate electrodes of the drive transistors 11, 12 and 13 shown in FIG. 3A. Reference numeral 44 represents the gate electrode of the load transistor 14. Reference numerals 21 and 23 represent the source electrodes of the three drive transistors, and reference numerals 22 and 24 represent the drain electrodes. Reference numerals 27 and 28 represent the electrodes connected to the substrate. The electrode 27 connected to the substrate corresponds to the electrode 16 shown in FIG. 3A. The electrode 27 is formed on the substrate and surrounds the gate electrodes 18, 19 and 20 and source/drain electrodes 21, 22, 23 and 24, respectively of the three drive transistors. The electrode 28 connected to the substrate corresponds to the electrode 17 shown in FIG. 3A. The electrode 17 is formed on the substrate and surrounds the gate, source and drain electrode 44, 25, 26 of the load transistor. Reference numeral 29 represents a power source line for a drain power supply ($V_{DD}$), and reference numeral 30 represents a power source line for a source power supply ($V_{SS}$). In FIG. 3c, a solid line and broken line indicate the elements on a same layer on the substrate surface, and a one-dot-chain line indicates a wiring layer above the first-mentioned layer. In FIG. 3C, impurity doped regions formed within the GaAs substrate are not shown. The device structure will be described later with reference to FIG. 4. Reference numeral 31 represents a contact hole for inter-layer connection. An output electrode 31 corresponds to the output terminal indicated at 15 in FIG. 3A. The device is usually covered with an insulator layer (not shown) to protect the device. Reference numeral 33 represents an exposed portion of the output electrode 32. The exposed portion 33 is not covered with an insulator layer, and the function of this portion will be described later.

Figure 4:
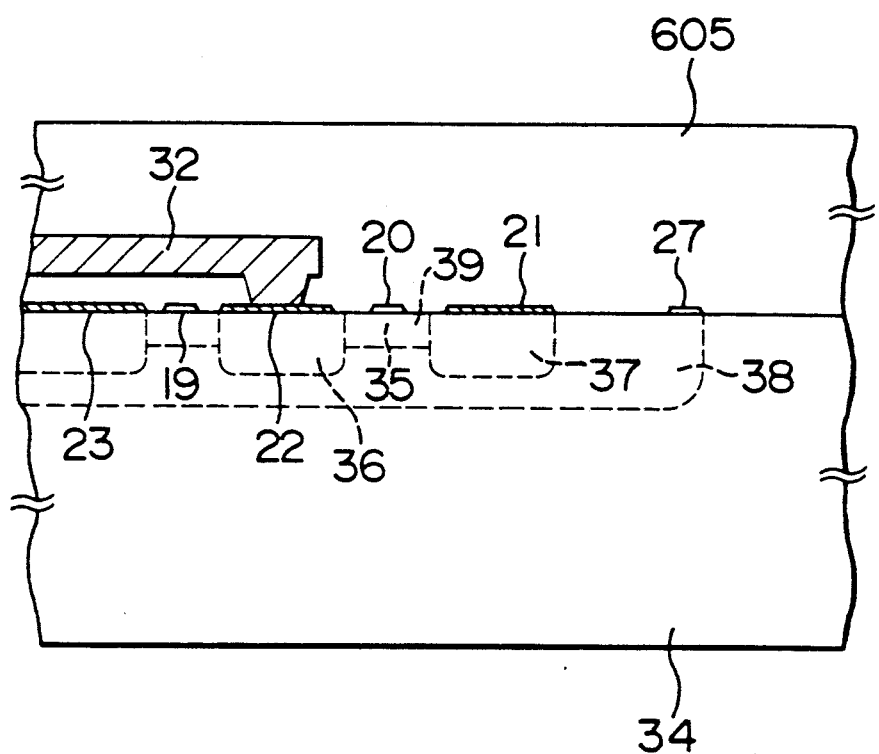
FIG. 4 is a cross section of the device shown in FIG. 3.

FIG. 4 is a cross section taken along line X—X' of FIG. 3C as viewed in the Y direction. Conductive regions 37, 36 and 35 with impurities doped therein are formed in the GaAs substrate 34 below the source, drain and gate electrodes 21, 22 and 20. An impurity doped region 38 is directly connected to the electrode 27. The potential applied to the electrode 27 connected to the substrate propagates to the channel region 39 of each transistor via the impurity doped region 38. In this embodiment, the impurity doped region 38 is in contact with the conductive regions 35, 36 and 37. This arrangement is not necessarily required, but the impurity doped region 38 may be formed only under the electrode 27 connected to the substrate. Usually, the conductive regions 35, 36 and 37 are doped with n-type impurities, and the impurity doped region 38 is doped with p-type impurities. Reference numeral 605 represents an insulator layer. In this embodiment, although the GaAs substrate is used, a Si substrate of low conductivity may also be used with the same arrangement as above.

As apparent from FIG. 3C, the electrodes 27 and 28 connected to the substrate so as to conduct forcible operation, do not increase the chip area. Also, as apparent from FIG. 4, the electrodes 27 and 28 can be tested prior to forming device electrodes 20 to 26 and wirings 29, 30 and 32, resulting in less influence upon the device yield. Testing the electrodes 27 and 28 can be readily performed by applying a potential to the electrodes with an electron or ion tester in the manner described later.

Figure 5A:
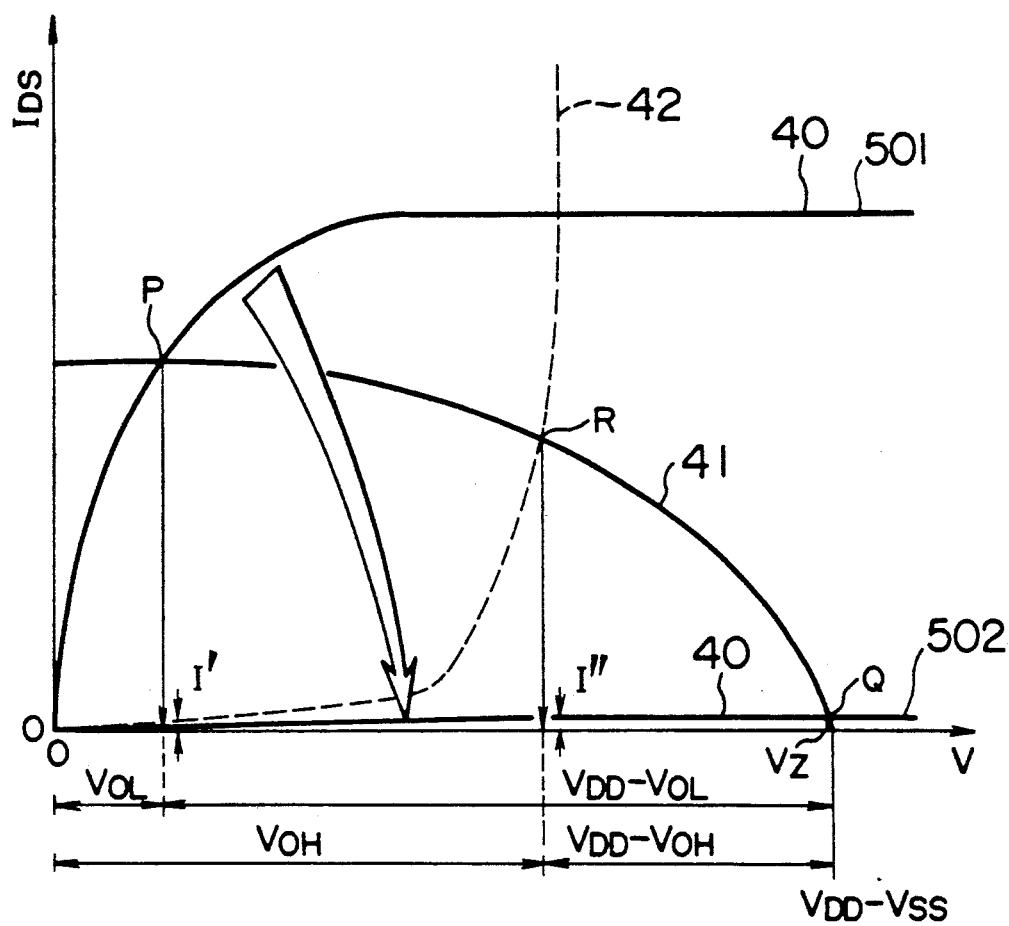
FIGS. 5A and 5B and FIGS. 6A and 6B are schematic illustrations for explaining the function of forcible operation.
Figure 5B:
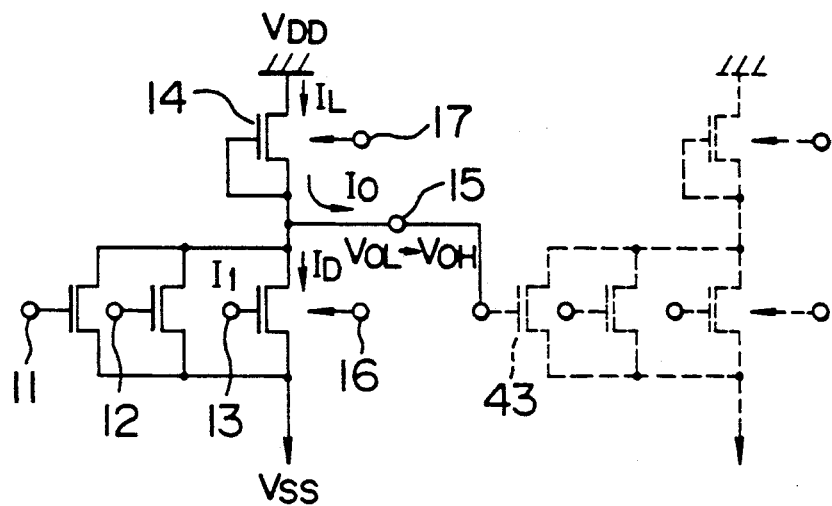
Figure 6A:
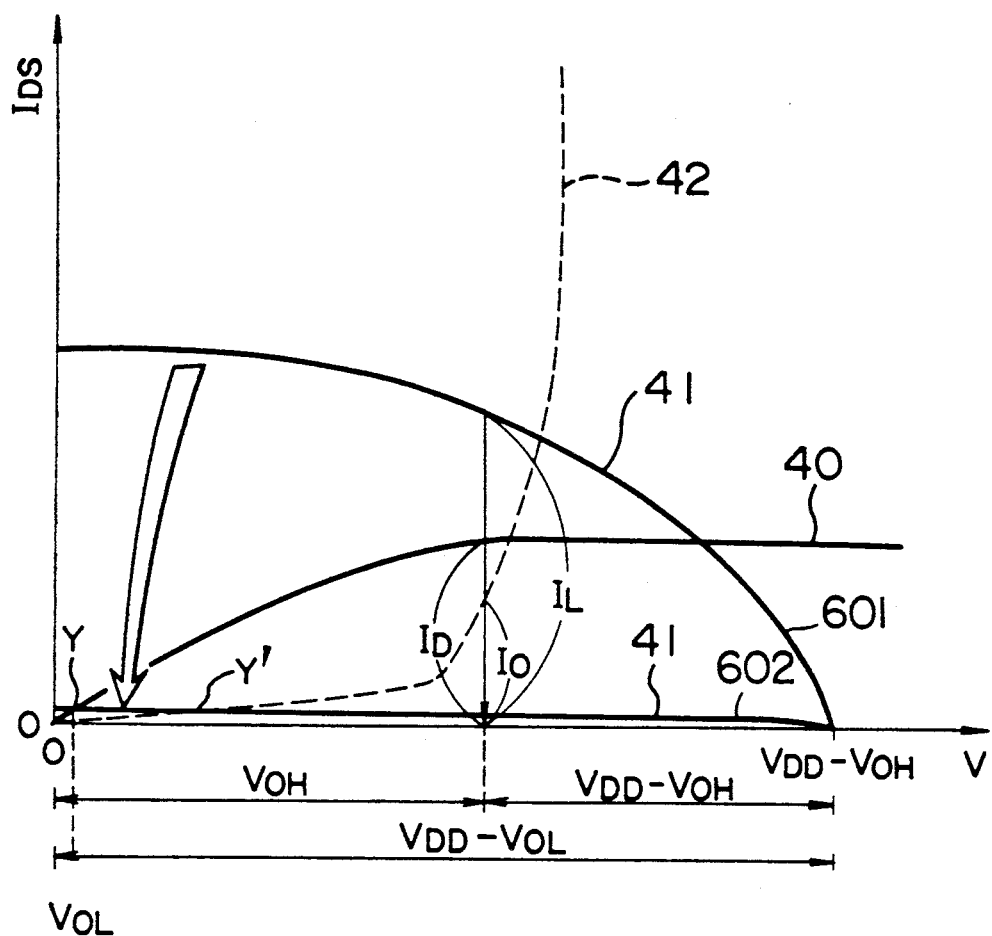

The mechanism of forcible operation of the device described with FIGS. 3A to 3C and FIG. 4, will be described with reference to FIGS. 5A, 5B and 6A, 6B. FIGS. 5A and 6A show the characteristic behaviors of the transistors constituting a gate, wherein the abscissa represents an output level at the output terminal 15 and the ordinate represents a current Ids flowing through the transistor. The current and voltage shown in FIGS. 5A and 6A are indicated in the corresponding circuit diagrams shown in FIGS. 5B and 6B.

FIGS. 5A shows the characteristic behavior when the output of the gate is forcibly set at a "1" level. A characteristic curve 40 is for the transistors 11 to 13, and a characteristic curve 41 is for the load transistor 14. A characteristic curve 42 is for the drive transistor 43 of the next stage gate to which the output of the preceding stage gate is coupled. A Schottky diode is generally formed between the gate and source electrodes of a GaAs transistor. Therefore, the transistor 43 of the next stage gate to which the output of the preceding stage gate is coupled, operates as a Schottky barrier diode with respect to the preceding stage gate. A characteristic curve 42 is for such a Schottky barrier diode. The output level of the gate is determined in accordance with these three characteristic curves. It is now assumed that the characteristic curve 40 of the drive transistor takes the curve indicated at 501 in FIG. 5A in an ordinary state. Then, the output level is determined by an intersection P between the characteristic curves 40 and 41. The output level is $V_{OL}$, namely, a "0" level. The current flowing to the transistor 43 of the next stage gate is about I' shown on the characteristic curve 42 so that the operation point is determined mostly by the intersection P between the two curves 40 and 41. From this state, a low potential is applied to the drive transistor side electrode 16 connected to the substrate. $V_{DD} - V_{OL}$ is a voltage between the source and drain of the load transistor 14. The following relationship is generally met between a change of threshold voltage Vth of a transistor and the substrate potential $V_{sub}$ in which the transistor is formed:

$$\Delta V_{th}(V_{sub}) = K\{(2\phi - V_{sub})^{\frac{1}{2}} - (2\phi)^{\frac{1}{2}}\} \tag{1}$$

This relationship can be applied to both Si and GaAs semiconductors. If the drive transistor side electrode 16 connected to the substrate is lowered, for example, to −5 V or less, the threshold voltage $V_{th}$ becomes high so that current does not flow through the drive transistor and the characteristic curve 40 thereof moves to that indicated at 502 in FIG. 5A. The output level is therefore determined mainly by an intersection R between the characteristic curves 41 and 42. The output level is $V_{OH}$, namely a "1" level. The current I" flowing to the drive transistor is negligibly small as shown in FIG. 5A.

Only one characteristic curve 40 is shown regardless of three drive transistors. The reason for this is that the drive transistor side electrode 27 (16) connected to the substrate surrounds the three drive transistors so that they operate in the same manner at a time. It is therefore possible to forcible setting the output of the gate at a $V_{OH}$, namely at a "1" level by lowering the substrate potential of the drive transistors. In this case, in order for the change of substrate potential of the drive transistors not to influence the substrate potential of the load transistor, the load transistor side electrode 17 connected to the substrate may be fixed, for example, to a Vss potential.

Figure 6B:
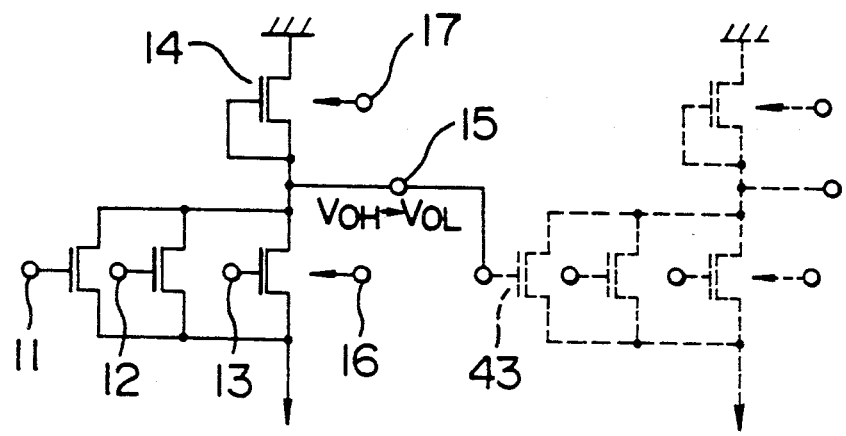

Next, the method of forcibly setting the output of a gate at a "0" level will be described with reference to FIGS. 6A and 6B. It is now assumed that the output of the gate is $V_{OH}$, namely a "1" level in an ordinary state. As shown in FIG. 6A, the following equation is satisfied at a voltage $V_{OH}$ on the abscissa, among the currents flowing through the drive transistors, load transistor and the next stage Schottky barrier diode:

$$I_L = I_D + I_O \tag{2}$$

If the potential at the load transistor side electrode 17 connected to the substrate is lowered, for example, to −5 V or less, then as described previously, the threshold voltage $V_{th}$ becomes high as expressed by the equation (1) so that current does not flow through the load transistor and the characteristic curve 41 of the load transistor is moved from the curve 601 to the curve 602.

As a result, the current is determined by an intersection Y between the curves 40 and 41 as shown in FIG. 6A. The output voltage of the gate becomes $V_{OL}$, namely, a "0" level. The output voltage is determined by the load transistor through which current scarcely flows and the drive transistors. In another case where the drive transistors through which current scarcely flows because of the output voltage of $V_{OL}$, the output voltage is determined by an intersection Y' between the curves 42 and 41. Also in this case, the output voltage becomes $V_{OL}$, namely, a "0" level.

As described above, by changing the substrate potential of the drive transistors or the load transistor, it is possible to forcibly set the output of the gate at a "1" level or at a "0" level.

Figure 7A:
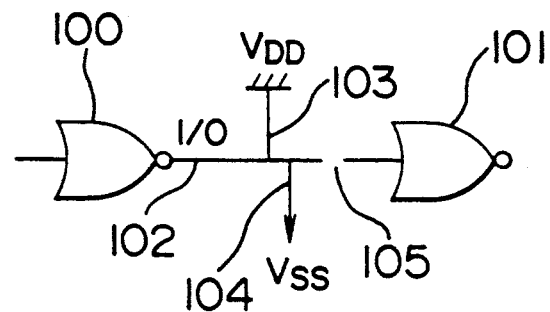
FIGS. 7A and 7B are schematic illustrations for explaining the events of fault.
Figure 7B:
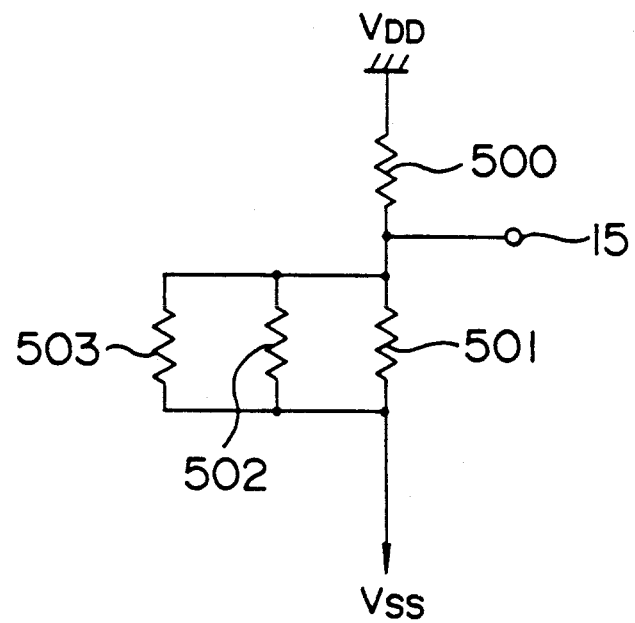

FIGS. 7A and 7B illustrate examples of events causing faults. In FIG. 7A, reference numeral 100 represents a preceding stage gate, and reference numeral 101 represents a next stage gate. A wiring 102 interconnects both the gates. Reference numeral 103 represents a short circuit between the wiring 102 and the power supply $V_{DD}$. Short circuits result mostly from improper etching, pin holes in an insulator layer, or foreign matters during the manufacturing processes for an LSI device. The potential at the wiring 102, namely, the output of the gate 100, is stuck at $V_{DD}$. The gate 100 is therefore a stuck-at "1" faulty gate. On the contrary, if the wiring 102 is short circuited to the power supply $V_{SS}$0, the gate 100 is a stuck-at "0" faulty gate. Reference numeral 105 represents a breakage of the wiring 102. In this case, the output of the gate 100 is not supplied to the next stage gate 101 which becomes a stuck-at "0" faulty gate same as the gate 100. Wiring breakages occur mostly by over etching or foreign matters during the manufacturing processes for an LSI device. The above-described faults are caused by wirings. Next, examples of the events causing faults due to device elements will be described. Sticking of the output level due to device elements is originated from no response of the device elements to an input signal. Namely, the device elements turn to be fixed resistors as shown in FIG. 7B. Reference numerals 500, 501, 502 and 503 correspond to the transistors 14, 13, 12 and 11 shown in FIG. 3A. These element failures occur during the manufacturing processes of the LSI device, or occur more often by imperfections of crystal in a wafer.

Figure 8:
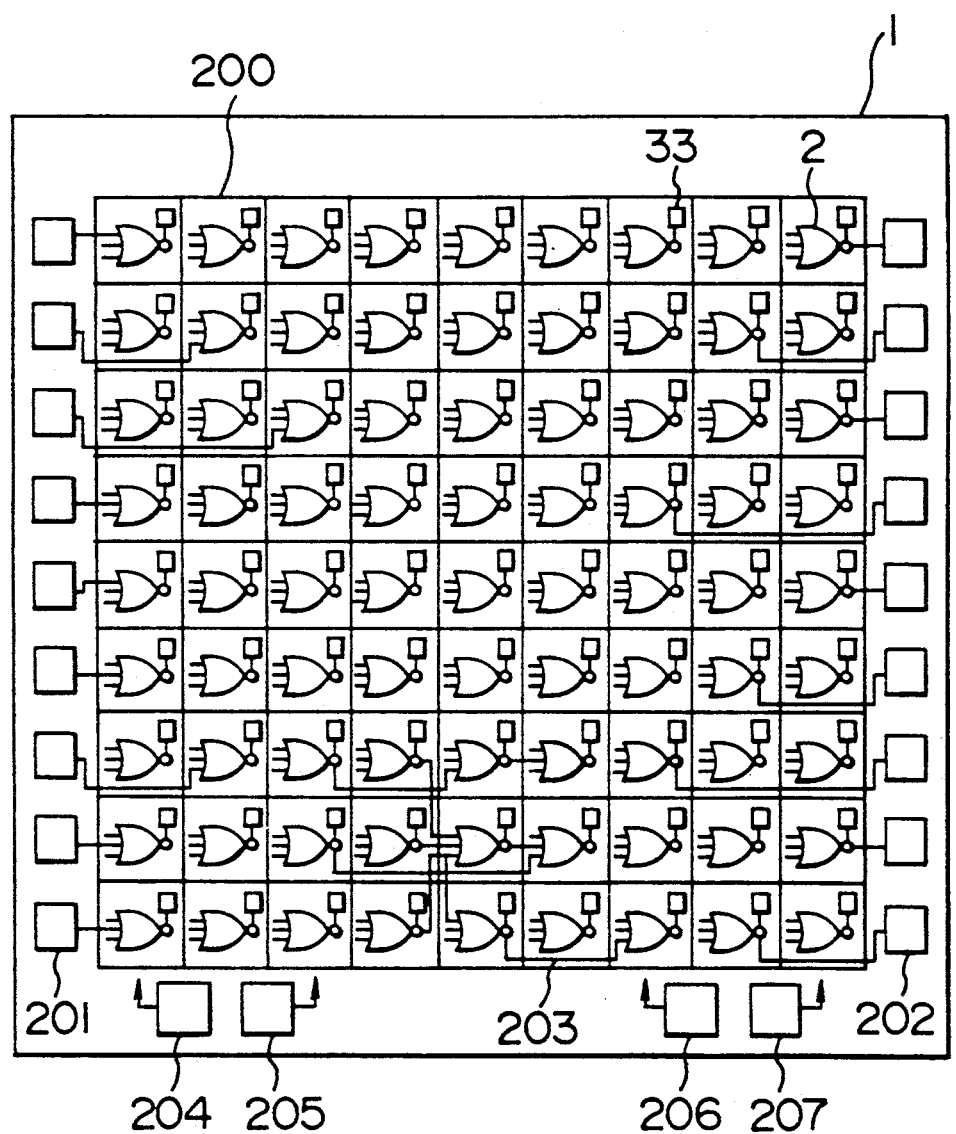
FIG. 8 shows the overall structure of an embodiment of an LSI device according to the present invention.

FIG. 8 is an example of the layout showing the overall arrangement of the LSI device according to the present invention. In FIG. 8, reference numeral 1 represents an LSI device, and reference numeral 200 represents an element forming region. Each gate 2 is constructed in the manner as detailed with reference to FIGS. 3A to 3C. In this embodiment, a number of gates 2 are disposed in a two dimensional matrix to have a gate array structure. The number of gates 2 are usually more than several thousands. In this example, a gate array of 9×9 gates is shown for the simplicity of the drawing. Reference numeral 201 represents an input pad for an input signal to the LSI device, and reference numeral 202 represents an output pad for an output signal from the LSI device. Reference numeral 203 represents a wiring for interconnection between gates, the gates are being interconnected so as to obtain a desired logic function. Reference numerals 204 and 205 represent power supply pads. Reference numerals 206 and 207 represent substrate potential electrode pads to which the substrate potential electrodes 16 (27) and 17

(28), described previously, of all the gates 2 are commonly connected. The substrate potential electrode pads 206 and 207 correspond to the terminals 8 and 9 shown in FIG. 1. By applying a proper potential to the electrode pad 206 or 207, all the gates, if normal, can be forcibly set at a "1" level or at a "0" level at the same time. Reference numeral 33 represents an electrode exposed portion shown in FIG. 3C. This portion is called hereinafter an output observation pad. The output observation pads 33 are disposed in a two dimensional matrix in this embodiment.

Figure 9B:
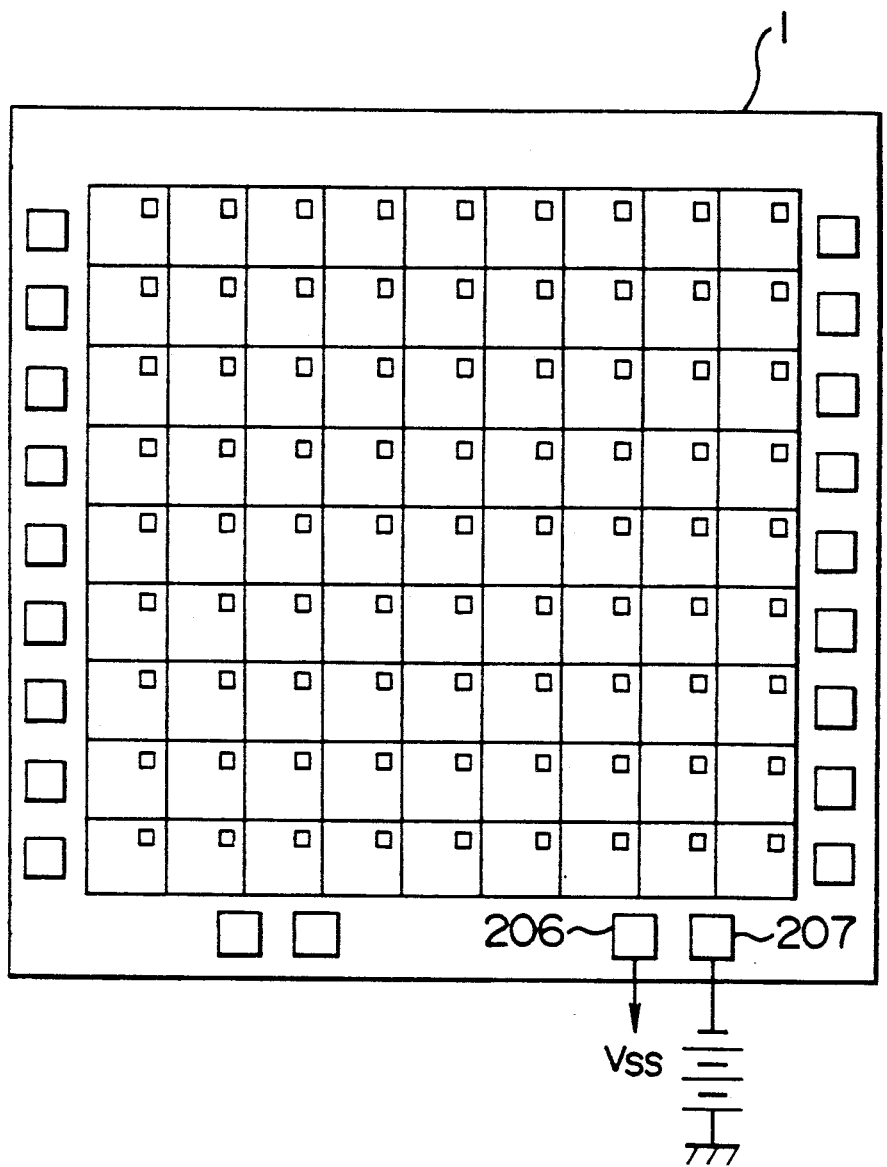
Figure 10:
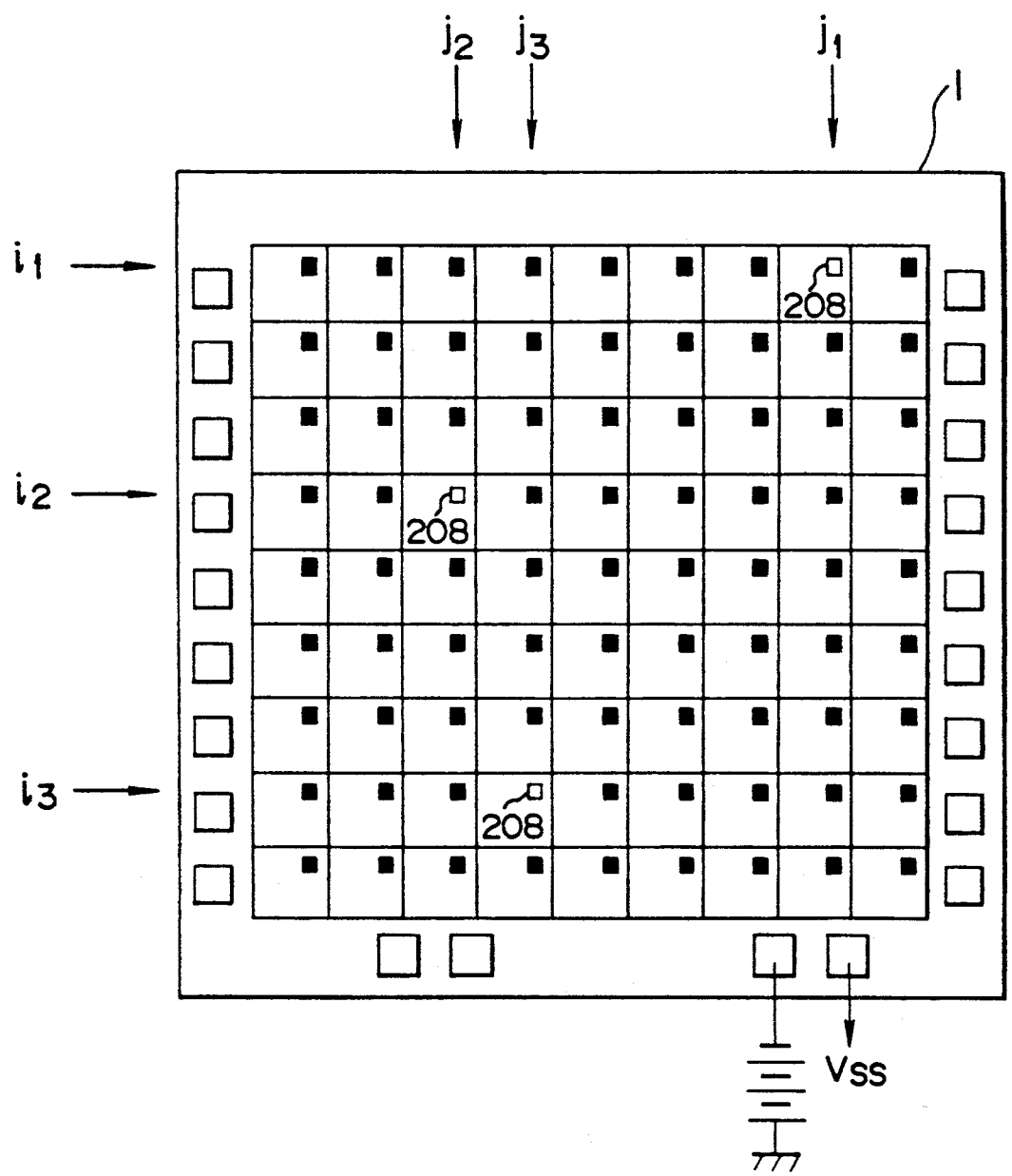
FIGS. 10 and 11 are schematic illustrations showing an embodiment of forcible operation of an LSI device having faults.
Figure 11:
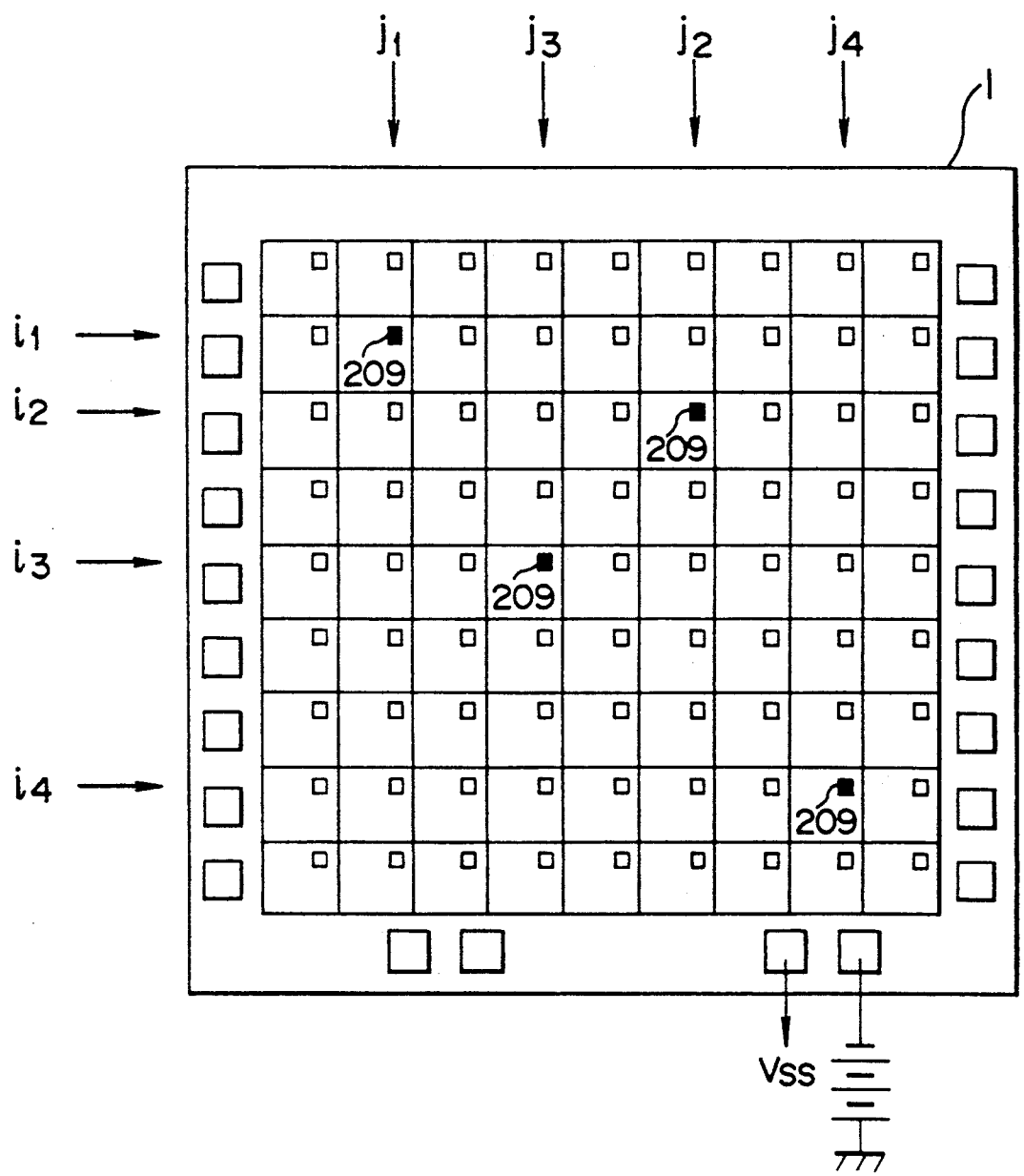

An embodiment of a testing method using the output observation pad 33 will be described with reference to FIGS. 9A, 9B, 10 and 11. This testing method uses a so-called electron or ion beam tester to observe an object to be tested based on secondary electron while scanning the object with an electron or ion beam. The device element forming region 200 of the LSI device 1 observed by using an electron or ion beam tester has a difference of shading between the higher and lower potential output observation pads 33. FIG. 9A shows the case where all the outputs of the gates 2 are forcibly set at a "1" level. It is seen that the output image of the output observation pads 33 become dark on the screen of an electron or ion beam tester. On the contrary, FIG. 9B shows the case where all the outputs of the gates 2 are forcibly set at a "0" level. It is seen that the output image of the outputs of the output observation pads 33 becomes bright. The output image for the LSI device having faulty gates is shown in FIGS. 10 and 11. FIG. 10 shows the output image of the LSI device having stuck-at "0" faulty gates which are indicated at 208. Such stuck-at "0" faulty gates will not be set at a "1" level even if they undergo the forcible operation. A stuck-at "0" faulty gate can thus be detected as a bright output observation pad among the matrix of dark output observation pads on the screen of an electron or ion beam tester. In FIG. 10, $(i_1, j_1)$, $(i_2, j_2)$ and $(i_3, j_3)$ are addresses for the faulty gates. Similarly, FIG. 11 shows the output image of the LSI device having stuck-at "1" faulty gates which are indicated at 209. All the normal gates are forcibly set at a "0" level. The stuck-at "0" faulty gates 209 become dark among the bright output observation pads. In FIG. 11, $(i_1, j_1)$, $(i_2, j_2)$, $(i_3, j_3)$ and $(i_4, j_4)$ are addresses for the faulty gates. In this embodiment, since the output observation pads 33 are disposed in a two dimensional matrix, the shading pattern can be tested at high speed.

If the logic circuit as of the present embodiments has a faulty gate caused by wiring failure, it seems that the gate shown in FIG. 7 follows the forcible operation, and the gate appears to have no wiring fault.

However, in this case, under the "1" level forcible operation, the output level of the gate 100 nevertheless takes a "1" level in the following manner. Specifically, since a connection to the next stage Schottky barrier diode as shown in FIG. 5B is broken, the characteristic curve 42 shown in FIG. 5A is to be omitted. As a result, the output level takes a potential Vz at the intersection Q between the characteristics curves 41 and 40. As seen from FIG. 5A, $$V_z > V_{OH} \tag{3}$$

Figure 12:
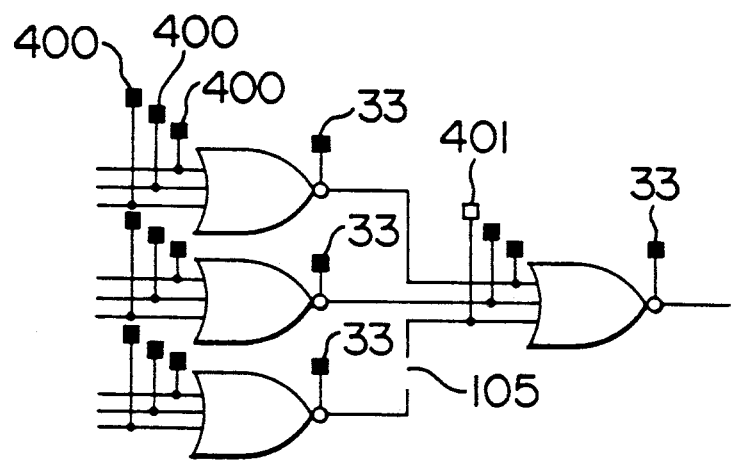
FIG. 12 is a circuit diagram showing an embodiment of detecting a fault caused by wiring breakage.

By detecting this difference as the shading obtained with an electron or ion beam tester in the similar manner discussed previously, it becomes possible to detect a fault caused by wiring breakage. In addition, a fault caused by wiring breakages can also be detected in the manner as described with the embodiment shown in FIG. 12. Referring to FIG. 12, reference numeral 400 represents an input observation pad provided at an input terminal of each gate. The input observation pad 400 has the similar structure to the output observation pad 33. The positions of the output observation pads 400 are shown in FIG. 3C. If the outputs of the gates are forcibly set at a level "1", the input observation pads 400 become dark. If a wiring breakage is present at 105, the input observation pad 401 does not become dark. In the above manner, a fault caused by a wiring breakage can be tested by providing input observation pads.

Figure 13:
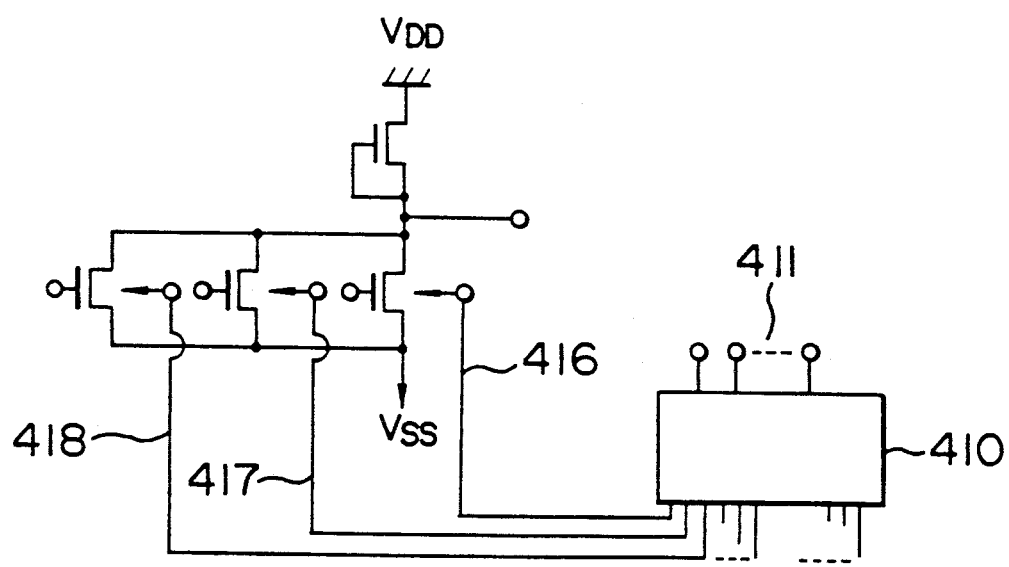
FIG. 13 is a circuit diagram showing an embodiment of forcible operation independently for each transistor constituting a gate.

In the description given so far, the electrode 16 connected to the substrate surrounds the drive transistors 11, 12 and 13 of each gate as indicated at 27 in FIG. 3C. If a more particular fault testing not in units of gates but in units of transistors is required, an embodiment as shown in FIG. 13 is used. In this embodiment, the drive transistors have their own electrodes 416, 417 and 418 connected to the substrate. The electrodes 416, 417 and 418 are connected to a selector 410. It is therefore possible to forcibly drive an arbitrary drive transistor by supplying a select signal to a select signal pin 411.

Figure 14:
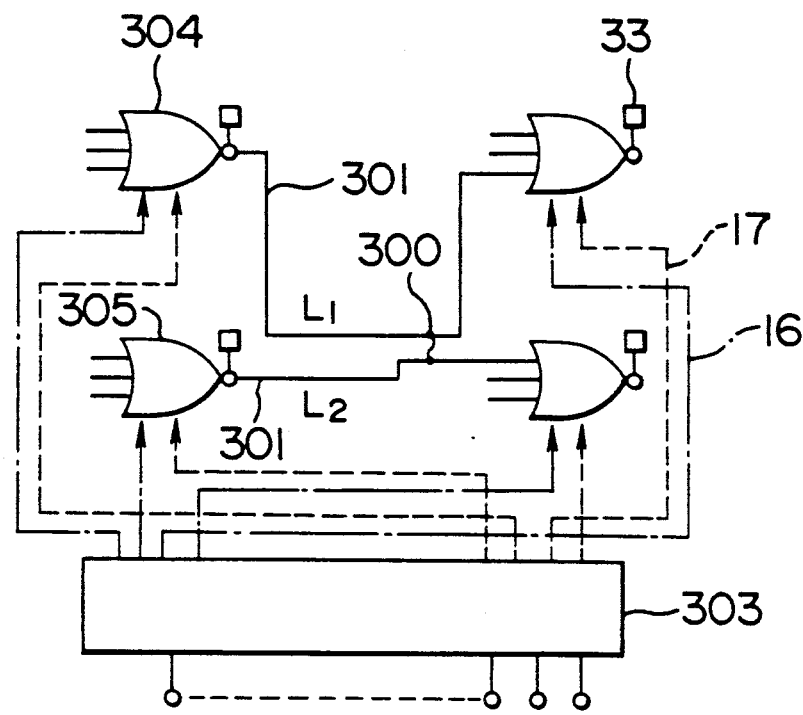
FIG. 14 is a circuit diagram showing an embodiment of detecting a short circuit between signal wirings.

The embodiments of the method of detecting a stuck-at "fixed level" faulty gate has been described in the foregoing. According to this invention, in addition to a stuck-at "fixed level" faulty gate, a short circuit between signal wirings interconnecting gates can also be detected. An embodiment for this is shown in FIG. 14. Reference numeral 301 represents a signal wiring which interconnects gates, and reference numeral 300 represents a short circuit between the wirings. A short circuit fault between signal wirings is difficult to be detected by using the above-described conventional technique, because the output level of gates is not fixed. In this embodiment, the description is directed to an LSI device the gate outputs of which are directly interconnected without using so-called wired logics. The circuit as shown in FIG. 3A does not generally use wired logics. In order to apply a substrate potential independently to each gate, the substrate potential electrodes 16 and 17 are connected to a selector 303. By using this selector, only the gate 304 is forcibly set at a "0" level, and the remaining gates are forcibly set at a "1" level. If there is not the short circuit, only the output of the gate 304 is set at a "0" level. However, because of the short circuit, the output of the gate 305 is also set at "0" level. This level "0" can be easily detected with an electron or ion beam tester.

Figure 15:
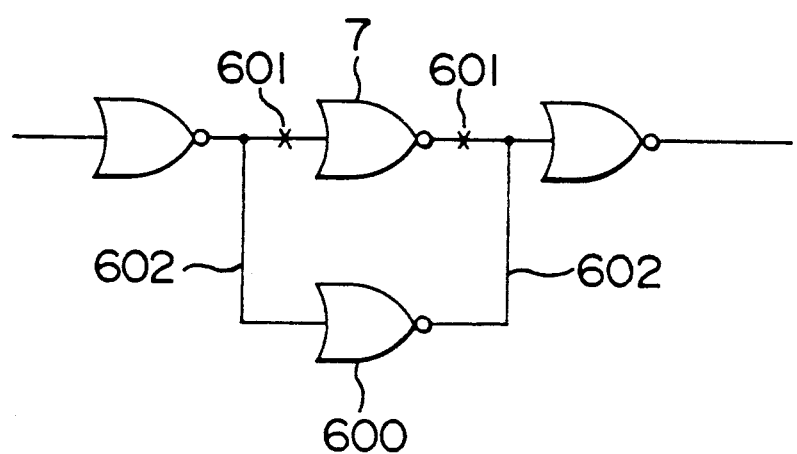
FIGS. 15, and 16A to 16C are diagrams showing an embodiment of repairing a fault.
Figure 16A:
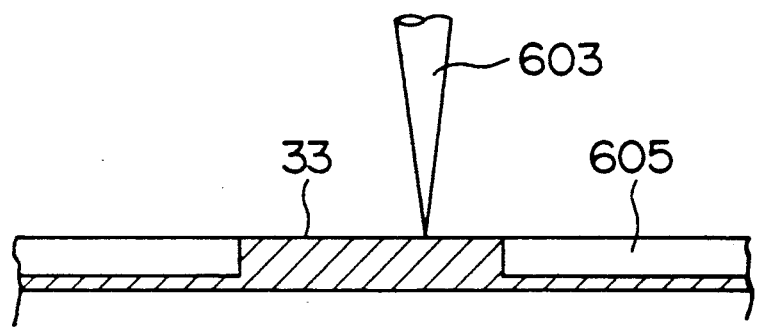
Figure 16B:
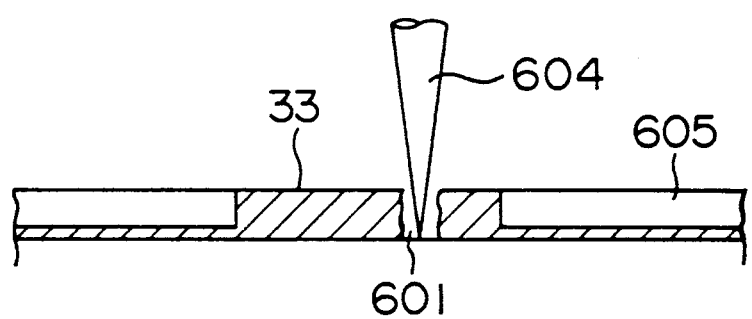
Figure 16C:
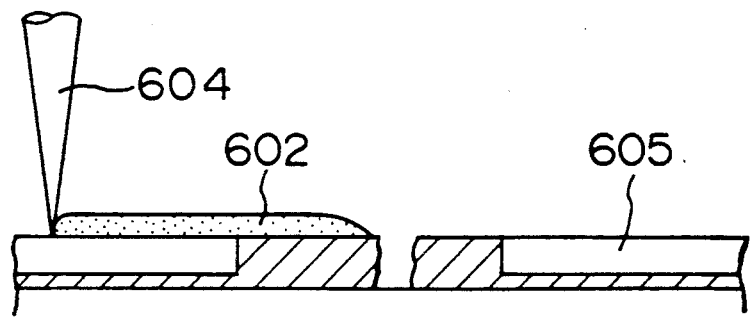

An embodiment of repairing a detected faulty gate will be described with reference to FIGS. 15, 16A to 16C. FIG. 15 is a circuit diagram used for explaining a replacement of a faulty gate 7 with a gate 600 for repair. The faulty gate 7 is cut at points 601 and isolated from the LSI device, by means of a well known technique, for example, by using an ion beam or a laser beam. The gate 600 for repair is connected to the circuit by using wirings 602 which are formed by means of a well known technique, for example, by means of a metal deposition method using an ion beam or a laser beam. Testing and repairing in this embodiment are carried out in the manner as shown in FIGS. 16A to 16C which are the cross sections of the LSI device near the output observation pad 33. In this embodiment, the output observation pad 33 is used both in detecting a fault and in reparing the LSI device. FIG. 16A shows testing the potential level at the output observation pad 33 by means of an electron or ion beam tester 603. Next, an ion beam or laser beam 604 is applied to the pad 33 to logically cut the faulty gate from the normal gate group as shown in FIG. 16B. Then, a wiring 602 for repair is deposited by using the ion beam or laser beam 604. In this embodiment, testing and repairing are carried out near at the same position. The center of beam is therefore not necessary to be moved to another repair position after testing, thus ensuring an effective combination of testing and repairing. Reference numeral 605 represents an insulator layer.

Figure 17:
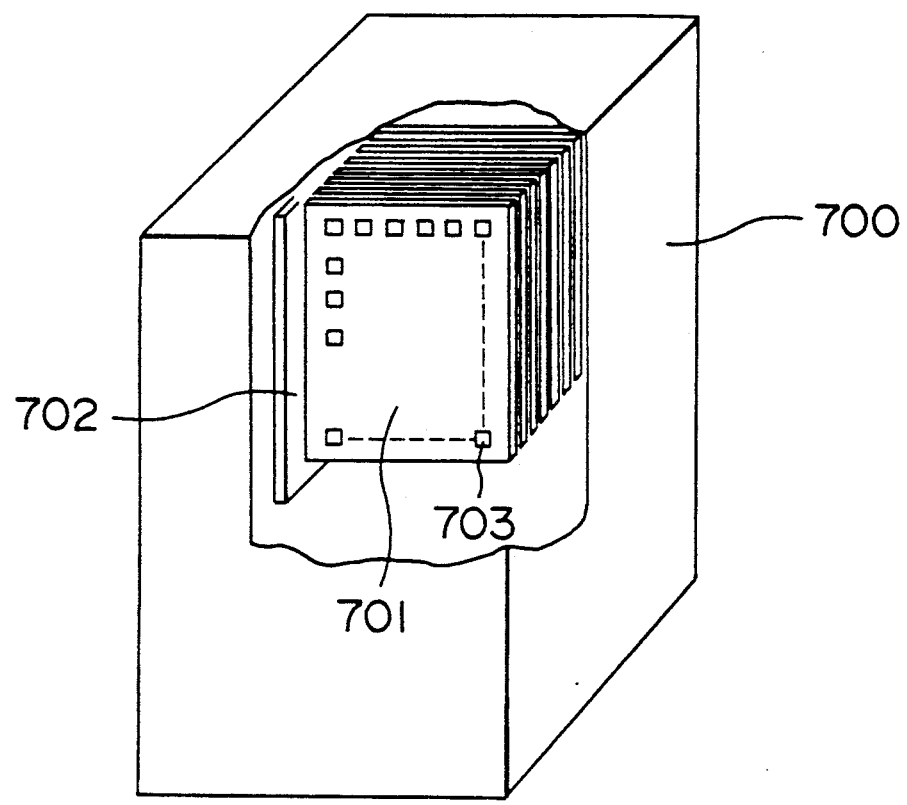
FIG. 17 is a perspective view showing an embodiment of a computer using LSI devices of this invention.

FIG. 17 is a schematic illustration of a computer mounted with LSI devices according to the present invention. Reference numeral 700 represents a housing of the computer, the bottom area of the housing being about 1 m×1 m, and the height thereof 1.5 m. Reference numeral 701 represents a printed circuit board mounted with LSI devices 703, the area of the board being 50 cm×30 cm. Several tens of packaged LSI devices 703 are mounted on each printed circuit board 701. There are mounted 20 printed circuit boards. The printed circuit boards 701 are electrically and mechanically coupled to a mother board 702. The total number of LSI devices is approximately 1,000. The number of types of LSI devices is 100 or more. According to the present invention, even a number of LSI devices of various types constructed as above can be tested at high speed and with high precision.

As appreciated from the foregoing description of the semiconductor integrated circuit of this invention, a fault testing can be carried out with a shorter development time and less development cost, while solving the problems associated with the conventional technique, and without deteriorating the performance and yield of LSI devices.

What is claimed is:

1. A semiconductor integrated circuit device comprising:
   input terminals;
   output terminals;
   a group of gates which receives an input signal applied to said input terminals and which outputs an output signal from said output terminals, said output signal corresponding to the state of said input signal; and
   means for simultaneously setting outputs of at least a plurality of gates of said group either at a "1" level or at a "0" level by forcibly setting a transistor included in each gate in either an "on" state or an "off" state irrespective of the state of said input signal applied to said input terminals and the state of an input signal applied to each gate to indicate whether any faulty gates are present in said group of gates.

2. A semiconductor integrated circuit device according to claim 1, wherein said means to forcibly setting comprises means for changing the potential of a semiconductor substrate in which each gate is formed.

3. A semiconductor integrated circuit device according to claim 2, wherein said potential changing means is provided for each gate of said group of gates.

4. A semiconductor integrated circuit device according to claim 3, wherein said potential changing means is provided for each transistor of each gate of said gate group.

5. A semiconductor integrated circuit device according to claim 1, wherein a plurality of gates comprising said gate group are disposed in a two dimensional matrix in a semiconductor substrate in which said gate group is formed.

6. A semiconductor integrated circuit device according to claim 1, wherein each gate of said gate group is comprised of a NOR gate.

7. A semiconductor integrated circuit device according to claim 2, wherein said substrate potential changing means comprises an impurity doped region formed in said semiconductor substrate, said impurity doped region surrounding at least a transistor of each gate so as to apply a potential to said transistor, and a terminal for applying the potential to said impurity doped region.

8. A semiconductor integrated circuit device according to claim 7, wherein said impurity doped region is of the opposite conductivity type to the impurity doped region within which said transistor of each gate is formed.

9. A semiconductor integrated circuit device according to claim 2, wherein each gate comprises at least one drive transistor for receiving an input signal to the gate, and a load transistor for supplying current to said drive transistor, the output of the gate being obtained at an interconnection between said drive transistor and said load transistor.

10. A semiconductor integrated circuit device according to claim 9, wherein said substrate potential changing means comprises first means for changing the potential of the substrate region within which said drive transistor is formed, and second means for changing the potential of the substrate region within which said load transistor is formed.

11. A semiconductor integrated circuit device according to claim 10, wherein said first means is provided independently for each said drive transistor.

12. A semiconductor integrated circuit device according to claim 1, wherein each of said gates is coupled to a power source having first and second potential levels, and wherein said means for setting forcibly sets the transistors in each gate at either an "on" state or an "off" state without changing said first and second potential levels applied to said gates.

13. A semiconductor integrated circuit device comprising:
   input terminals;
   output terminals;
   a group of gates which receives an input signal applied to said input terminals and which outputs an output signal from said output terminals, said output signal corresponding to the state of said input signal;
   an observation pad formed on a portion of at least one of the output and input areas of each gate of said group of gates, said observation pad being exposed without being covered with an insulator layer; and
   means for changing a potential of a semiconductor substrate in which each gate is formed.

14. A semiconductor integrated circuit device according to claim 28, wherein each gate comprises at least one drive transistor for receiving an input signal to the gate, and a load transistor for supplying current to said drive transistor, the output of the gate being obtained at an interconnection between said drive transistor and said load transistor.

15. A semiconductor integrated circuit device according to claim 14, wherein said substrate potential changing means comprises first means for changing the potential of the substrate region within which said drive transistor is formed, and second means for changing the potential of the substrate region within which said load transistor is formed.

16. A semiconductor integrated circuit device according to claim 15, wherein said first means is provided independently for each said drive transistor.

17. A semiconductor integrated circuit device according to claim 15, wherein said first means comprises an impurity doped region formed in said semiconductor substrate, said impurity doped region surrounding at least said drive transistor of each gate so as to apply a potential to said drive transistor, and a terminal for applying the potential to said impurity region.

18. A semiconductor integrated circuit device according to claim 15, wherein said first means comprises an impurity doped region formed in said semiconductor substrate, said impurity doped region surrounding at least said load transistor of each gate so as to apply a potential to said load transistor, and a terminal for applying the potential to said impurity region.

19. A semiconductor integrated circuit device according to claim 13, wherein the potential changing means independently changes the potential of said semiconductor substrate for said each gate.

20. A method of testing a semiconductor integrated circuit device comprising input terminals; output terminals; a group of gates which receives an input signal applied to said input terminals and which outputs an output signal from said output terminals, said output signal corresponding to the state of said input signal; and an observation pad formed on a portion of at least one of the output and input areas of each gate, said observation pad being exposed without being covered with an insulator layer, said method comprising the steps of:
forcibly setting the output of each gate of said group either at "1" level or at a "0" level irrespective of the state of said input signal applied to said input terminals and an input signal applied to each gate;
displaying the potential of said observation pad as a shading image when a predetermined beam is applied to said observation pad; and
detecting a faulty gate based on said shading image.

21. A method of testing a semiconductor integrated circuit device according to claim 20, wherein said predetermined beam is an electron beam.

22. A method of testing a semiconductor integrated circuit device according to claim 20, wherein said predetermined beam is an ion beam.

23. A method of testing a semiconductor integrated circuit device according to claim 20, wherein said observation pad is covered with an insulator layer after fault testing.

24. A method of testing of a semiconductor integrated circuit device according to claim 20, wherein a faulty gate in said gate group is logically separated from said gate group by cutting said observation pad.

25. A method of testing a semiconductor integrated circuit device according to claim 24, wherein said faulty gate is cut off by an ion beam.

26. A method of testing a semiconductor integrated circuit device according to claim 24, wherein said faulty gate is cut off by a laser beam.

27. A semiconductor integrated circuit device comprising:
input terminals;
output terminals;
a group of gates which receives an input signal applied to said input terminals and which outputs an output signal from said output terminals, said output signal corresponding to the state of said input signal; and
means for forcibly setting the output of each gate of said group either at a "1" level or at a "0" level irrespective of the state of said input signal applied to said input terminals and the state of an input signal applied to each gate,
wherein said means for forcibly setting comprises means for changing the potential of a semiconductor substrate in which each gate is formed, and
wherein said substrate potential changing means comprises an impurity doped region formed in said semiconductor substrate, said impurity doped region surrounding at least a transistor of each gate so as to apply a potential to said transistor, and a terminal for applying the potential to said impurity doped region.

28. A semiconductor integrated circuit device according to claim 27, wherein said impurity doped region is of the opposite conductivity type to the impurity doped region within which said transistor of each gate is formed.

29. A semiconductor integrated circuit device comprising:
input terminals;
output terminals;
a group of gates which receives an input signal applied to said input terminals and which outputs an output signal from said output terminals, said output signal corresponding to the state of said input signal; and
means for forcibly setting the output of each gate of said group either at a "1" level or at a "0" level irrespective of the state of said input signal applied to said input terminals and the state of an input signal applied to each gate,
wherein said means for forcibly setting comprises means for changing the potential of a semiconductor substrate in which each gate is formed, and
wherein each gate comprises at least one drive transistor for receiving an input signal to the gate, and a load transistor for supplying current to said drive transistor, the output of the gate being obtained at an interconnection between said drive transistor and said load transistor.

30. A semiconductor integrated circuit device according to claim 29, wherein said substrate potential changing means comprises first means for changing the potential of the substrate region within which said drive transistor is formed, and second means for changing the potential of the substrate region within which said load transistor is formed.

31. A semiconductor integrated circuit device according to claim 30, wherein said first means is provided independently for each said drive transistor.

* * * * *